(12) United States Patent
Tometsuka et al.

(10) Patent No.: US 6,332,898 B1
(45) Date of Patent: Dec. 25, 2001

(54) SUBSTRATE PROCESSING APPARATUS AND MAINTENANCE METHOD THEREFOR

(75) Inventors: Kouji Tometsuka; Mitsuhiro Hirano; Tetsuya Marubayashi, all of Tokyo (JP)

(73) Assignee: Kokusai Electric Co., Ltd., Tokyo (JP)

( * ) Notice: Subject to any disclaimer, the term of this patent is extended or adjusted under 35 U.S.C. 154(b) by 0 days.

(21) Appl. No.: 09/565,376

(22) Filed: May 5, 2000

Related U.S. Application Data

(62) Division of application No. 09/031,950, filed on Feb. 27, 1998, now Pat. No. 6,143,040.

(30) Foreign Application Priority Data

Feb. 28, 1997 (JP) .................................................. 9-061813

(51) Int. Cl.[7] .............................. H01L 21/00; H01L 21/64
(52) U.S. Cl. ........................................ 29/25.01; 414/217
(58) Field of Search ........................... 29/25.01; 414/217, 414/940; 438/908; 204/298.35, 298.26, 298.25; 118/733, 719, 50

(56) References Cited

U.S. PATENT DOCUMENTS 4,816,098 * 3/1989 Davis et al. .
5,562,383 10/1996 Iwai et al. .

* cited by examiner

Primary Examiner—David E. Graybill
(74) Attorney, Agent, or Firm—Birch, Stewart, Kolasch & Birch, LLP

(57) ABSTRACT

A substrate processing apparatus comprises a semiconductor wafer processing chamber, a wafer transfer device, a wafer cassette holding unit, a wafer cassette transfer device and a wafer cassette bringing in/out section disposed in this order and a housing. The wafer cassette holding unit is movable between a wafer processing time position and a maintenance time position thereof and the wafer cassette transfer device is movable between a wafer processing time position and a maintenance time position thereof. The wafer cassette bringing in/out section is capable of rotating forward of the housing, whereby the front face of said housing is opened. With the wafer cassette holding unit being positioned at the maintenance time position thereof, the wafer cassette transfer device being positioned at the maintenance time position thereof and the wafer cassette bringing in/out section being rotated forward of the housing to open the front face thereof, maintenance of the wafer transfer device can be performed from the front face of the housing.

25 Claims, 14 Drawing Sheets

SUBSTRATE PROCESSING APPARATUS AND MAINTENANCE METHOD THEREFOR

This application is a divisional of application Ser. No. 09/031,950, filed on Feb. 27, 1998, U.S. Pat. No. 6,143,040 entire contents of which are hereby incorporated by reference.

BACKGROUND OF THE INVENTION

1. Field of the Invention

The present invention relates to a substrate processing apparatus and a maintenance method therefor, and particularly to a semiconductor device manufacturing apparatus and a maintenance method therefor wherein a semiconductor wafer is handled as a substrate.

2. Description of the Related Art

A semiconductor device manufacturing apparatus includes, for example, a reaction furnace, a boat for holding a large number of wafers, a boat elevator for inserting and retrieving the boat into and from the reaction furnace, a cassette shelf for accommodating wafer cassettes in which the wafers are placed, a wafer transfer device for transferring the wafers between the boat and the cassette, a cassette stage for delivering and receiving the wafer cassettes to and from the outside of the semiconductor device manufacturing apparatus, and a cassette transfer device for transferring the cassettes between the cassette stage and the cassette shelf.

In the above described semiconductor device manufacturing apparatus, the maintenance is performed from the three directions, i.e., from the front face, the back face and one of the side faces, and therefore a space for maintenance must be secured around the semiconductor device manufacturing apparatus, and a large space is required for installing the apparatus, and it is uneconomical.

SUMMARY OF THE INVENTION

It is, therefore, a main object of the present invention to provide a substrate processing apparatus which requires a small space for maintenance and a small space to be installed, and to provide a maintenance method therefor.

According to a first aspect of the present invention, there is provided a substrate processing apparatus, comprising: a substrate processing chamber, a substrate transfer device and a substrate carrier holding unit, wherein the substrate processing chamber, the substrate transfer device and the substrate carrier holding unit are disposed in this named order, and the substrate carrier holding unit is movable between a first substrate processing time position and a first maintenance time position.

According to a second aspect of the present invention, there is provided a substrate processing apparatus, comprising: a substrate processing chamber, a substrate carrier transfer device, a substrate carrier bringing in/out section and a housing for covering the substrate processing chamber, the substrate carrier transfer device and the substrate carrier bringing in/out section, wherein the substrate processing chamber, the substrate carrier transfer device and the substrate carrier bringing in/out section are disposed in this named order, and the substrate carrier bringing in/out section is capable of rotating forward of the housing, whereby at least a portion of a front face of the housing can be opened.

According to a third aspect of the present invention, there is provided a maintenance method for a substrate processing apparatus which comprises a substrate processing chamber, a substrate transfer device and a substrate carrier holding unit, wherein the substrate processing chamber, the substrate transfer device and the substrate carrier holding unit are disposed in this named order, and the substrate carrier holding unit is movable between a first substrate processing time position and a first maintenance time position, comprising the steps of:

moving the substrate carrier holding unit from the first substrate processing time position to the first maintenance time position, and thereafter performing a maintenance for the substrate transfer device.

According to a fourth aspect of the present invention, there is provided a maintenance method for a substrate processing apparatus which comprises a substrate processing chamber, a substrate carrier transfer device, a substrate carrier bringing in/out section and a housing for covering the substrate processing chamber, the substrate carrier transfer device and the substrate carrier bringing in/out section, wherein the substrate processing chamber, the substrate carrier transfer device and the substrate carrier bringing in/out section are disposed in this named order, and the substrate carrier bringing in/out section is capable of rotating forward of the housing, whereby at least a portion of a front face of the housing can be opened, comprising the steps of:

rotating the substrate carrier bringing in/out section forward of the housing, whereby at least the portion of the front face of the housing is opened, and performing a maintenance of the substrate processing apparatus between the substrate processing chamber and the substrate carrier bringing in/out section.

According to a fifth aspect of the present invention, there is provided a maintenance method for a substrate processing apparatus which comprises a substrate processing chamber, a substrate transfer device, a substrate carrier holding unit, a substrate carrier transfer device and a substrate carrier bringing in/out section in this named order, comprising the steps of:

moving the substrate carrier bringing in/out section to a maintenance position;

moving the substrate carrier transfer device to a maintenance position;

moving the substrate carrier holding unit to a maintenance position; and performing a maintenance for the substrate transfer device.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

A semiconductor device manufacturing apparatus includes, for example, a reaction furnace, a boat for holding a large number of wafers, a boat elevator for inserting and retrieving the boat into and from the reaction furnace, a cassette shelf for accommodating wafer cassettes in which the wafers are placed, a wafer transfer device for transferring the wafers between the boat and the cassette, a cassette stage for delivering and receiving the wafer cassettes to and from the outside of the semiconductor device manufacturing apparatus, and a cassette transfer device for transferring the cassettes between the cassette stage and the cassette shelf.

In the reaction furnace, processes such as a thin film formation on a wafer surface, impurity diffusion and etching, are carried out, and wafers are processed in an evacuated and highly cleaned atmosphere. The wafers are processed at a high temperature. Therefore, in order to prevent native oxide from being formed when the boat is inserted or retrieved into or from the reaction furnace, or to prevent particles from entering, there is an apparatus in which the reaction furnace is connected to a load lock chamber for accommodating the boat elevator so that the boat is inserted or retrieved in an evacuated or an inert gas atmosphere.

Figure 15:
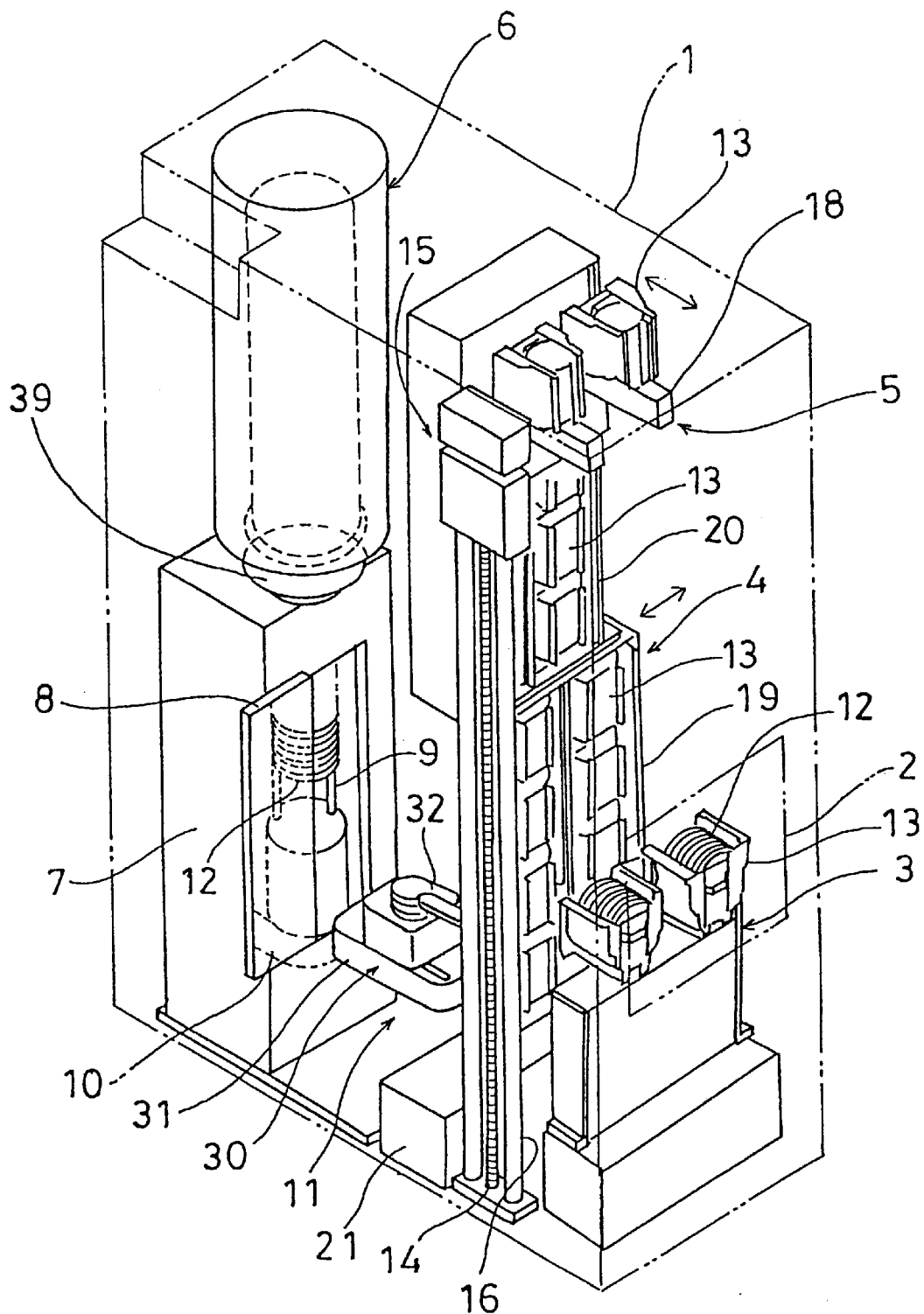
FIG. 15 is a schematic perspective view of a semiconductor device manufacturing apparatus as a tentative example.
Figure 16:
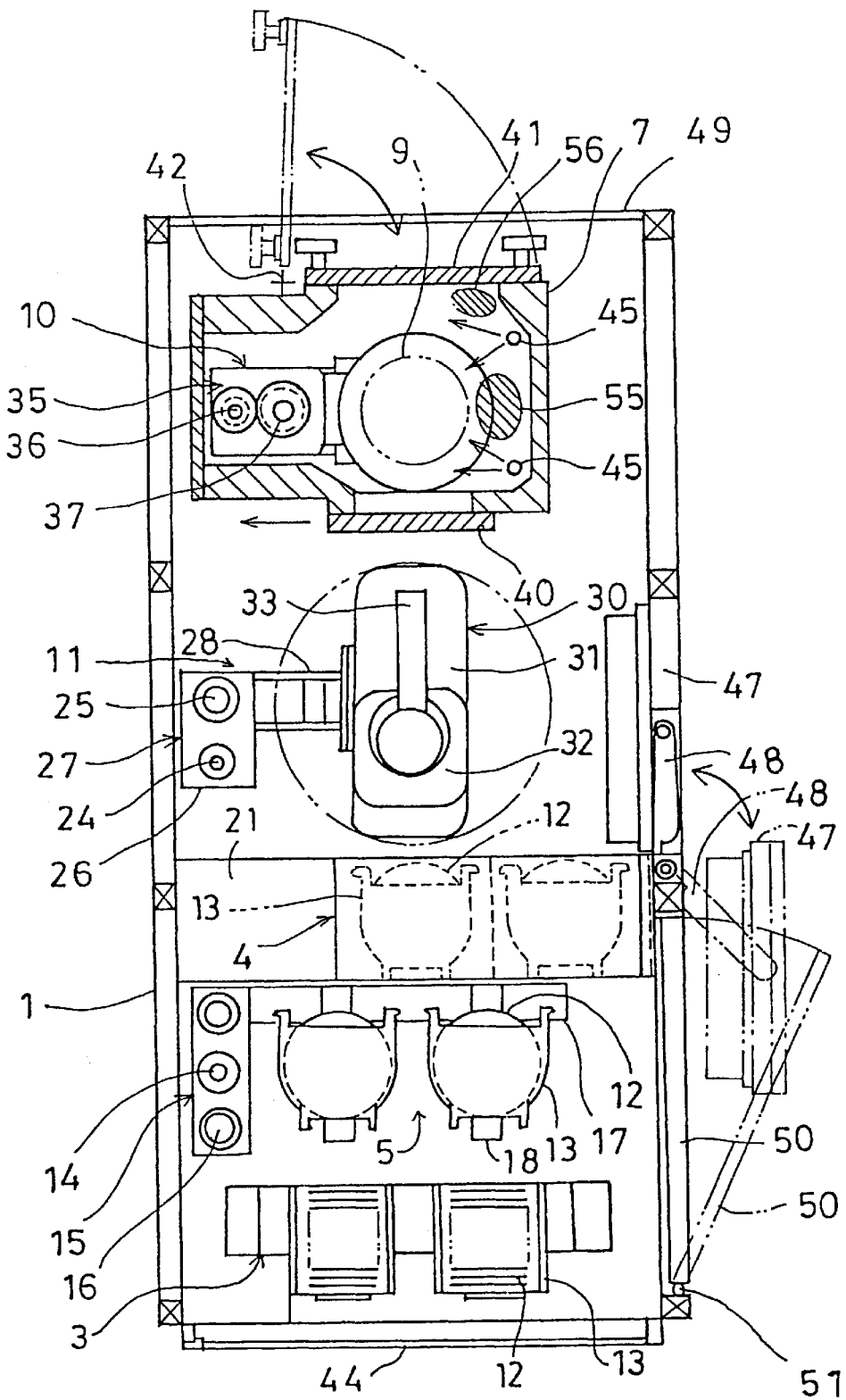
FIG. 16 is a transverse cross-sectional view of the semiconductor device manufacturing apparatus as the tentative example.

The present inventors first thought up a tentative example of a semiconductor device manufacturing apparatus as shown in FIGS. 15 and 16 as a semiconductor device manufacturing apparatus including a load lock chamber of the type described above.

In the semiconductor device manufacturing apparatus of this tentative example, a front panel 44 is attached to a front face of a housing 1 by a hinge (not shown) such that the front panel 44 is allowed to be opened and closed. The front panel 44 is provided with an access opening 2 having a slide door (not shown), and a cassette stage 3 is provided adjacent to the access opening 2. A cassette shelf 4 is provided such as to be opposed to the cassette stage 3, and a cassette transfer device 5 is provided between the cassette shelf 4 and the cassette stage 3. A reaction furnace 6 is provided in rearward upper portion of the interior of the housing 1, and a vertically long rectangular parallelepiped load lock chamber 7 is airtightly connected to the lower side of the reaction furnace 6. A load lock door 8 is mounted at a front side of the load lock chamber 7 at a position facing the cassette shelf 4. A boat elevator 10 for inserting and retrieving a boat 9 into and from the reaction furnace 5 is provided in the load lock chamber 7.

A wafer transfer device 11 is provided between the cassette shelf 4 and the load lock chamber 7, so as to transfer a wafer 12 between the load lock chamber 7 and the wafer cassettes 13 in the cassette shelve 4 by the wafer transfer device 11.

The wafer cassette 13 in which the wafers 12 are placed is transferred in from an external transport device (not shown), and is placed on the cassette stage 3 The cassette stage 3 is capable of horizontally receiving two wafer cassettes 13 in parallel, and turning each of such received two wafer cassettes 13 by 90° and take them into the inside of the housing 1.

The cassette transfer device 5 includes an elevator mechanism 15. The elevator mechanism 15 includes a screw rod 14 standing up from a bottom face of the housing 1, a guide rod 16, and a relay stage 17 which is engaged with the screw rod 14 through threads and is slidably fitted to the guide rod 16. The screw rod 14 is rotated by a motor (not shown) so that the relay stage 17 is raised and lowered along the guide rod 16. The relay stage 17 is provided with an advancing/retreating mechanism 18 for advancing and retreating the wafer cassette 13 toward and from the cassette stage 3 and the cassette shelf 4.

The cassette shelf 4 comprises a lower shelf 19 and an upper shelf 20. The lower shelf 19 includes a wafer accommodating frame comprising a plurality of stages in two rows, and the upper shelf 20 also includes a wafer accommodating frame comprising a plurality of stages in two rows. The lower shelf 19 is capable of moving in a direction perpendicular to the advancing/retreating direction of the advancing/retreating mechanism 18 by a horizontal driving mechanism 21, and is capable of straightly or directly facing the cassette transfer device 5 or the wafer transfer device 11.

The wafer transfer device 11 includes an upright screw rod 24, a guide rod 25, a motor (not shown) for rotating the screw rod 24, an elevator mechanism 27 comprising an elevating block 26 fitted to the screw rod 24 and the guide rod 25, and a wafer handler 30 provided on an arm 28 fixed to the elevating block 26 such that the wafer handler 30 can be rotate about a vertical axis thereof. The wafer handler 30 comprises an elevating stage 31 rotatably provided on the arm 28, and a wafer chuck 32 horizontally movably provided on the elevating stage 31. The wafer chuck 32 includes a plurality stages of wafer holding plates 33 extending in a horizontal direction.

The boat elevator 10 is provided in the load lock chamber 7, and includes an elevator mechanism 35. Similar to the elevator mechanism 27, the elevator mechanism 35 comprises a screw rod 36, a guide rod 37 and the like. The boat 9 is provided uprightly on a elevator table 38 which is raised and lowered by the elevator mechanism 35. The boat elevator 10 inserts and retrieves the boat 9 into and from the reaction furnace 6. In a state where the boat 9 is lowered, a furnace opening of the reaction furnace 6 is closed by a furnace lid 39.

The load lock chamber 7 is of a substantially rectangular shape in horizontal cross section and is of an airtight structure. The load lock chamber 7 is provided at its portion facing the wafer handler 30 with a door gate valve 40 for sliding movement, and is rotatably provided through a hinge 42 at the opposite side to the door gate valve 40 with a back face maintenance door 41 for maintenance. A rear panel 49 of the housing 1 facing the back face maintenance door 41 is easily attachable and detachable with respect to the housing 1. A side panel 50 is turnably provided on the housing 1 at the side of the cassette transfer device 5 through a hinge 51.

The interior of the load lock chamber 7 is repeatedly evacuated and restored to the atmospheric pressure. The interior of the load lock chamber 7 is restored to the atmospheric pressure by introducing inert gas, e.g., nitrogen gas from gas purge nozzles 45 uprightly provided at corners of the load lock chamber 7 along a wall face. If the particles are whirled up, the particles contaminate the wafer and therefore, when the interior is restored to the atmospheric pressure, a gas is introduced so that the gas does not whirl up the particles.

A side maintenance door 47 is mounted to a side face of the housing 1 in which the side panel 50 is provided and which is located at a side of the cassette shelf 4 and opposed to the wafer transfer device 11. One end of the hinge lever 48 is attached to the side maintenance door 47 in a pivotal manner, and the other end of the hinge lever 48 is pivotally supported on the housing 1.

A series of operations in the semiconductor device manufacturing apparatus according the tentative example will be described hereafter. The wafer cassette 13 transferred from the external transport device (not shown) is placed on the cassette stage 3, and the cassette stage 3 then turns the wafer cassette 13 by 90° and transfers it to the cassette shelf 4.

The transfer of the wafer 12 to the boat 9 by the wafer transfer device 11 is carried out with respect to the lower shelf 19. Preparing for the transfer of the wafer 12, the boat 9 is lowered by the boat elevator 10, the furnace opening of the reaction furnace 6 is closed by the furnace lid 39, and a purging gas such as nitrogen gas is introduced into the load lock chamber 7 from the gas purge nozzles 45. After the interior of the load lock chamber 7 has been restored to the atmospheric pressure, the door gate valve 40 is opened.

The horizontal driving mechanism 21 horizontally moves the lower shelf 19, and positions the wafer cassette 13 which is to be transferred, such that the wafer cassette 13 faces the wafer handler 30. The wafer transfer device 11 transfers the wafer 12 from the wafer cassette 13 to the boat 9 with cooperation of the advancing and retreating movements of the wafer chuck 32, the raising and lowering movement as well as rotational movement of the elevator stage 31. The wafers 12 are transferred with respect to some of the wafer cassettes 13, and after a predetermined number of wafers have been transferred to the boat 9, the door gate valve 40 is closed, and the load lock chamber 7 is evacuated.

After the evacuation is completed, or when a gas is introduced from the gas purge nozzles 45 and the interior of the load lock chamber 7 is restored to the atmospheric pressure after the evacuation is completed, the furnace lid 39 is opened, and the boat 9 is inserted into the reaction furnace 6 by the boat elevator 10. After a necessary process such as formation of a thin film on the wafer 12 has been carried out in the reaction furnace 6, the furnace lid 39 is opened, and the boat 9 is retrieved by the boat elevator 10. The door gate valve 40 is opened in a state where the interior of the load lock chamber 7 is at the atmospheric pressure.

The processed wafer 12 is transferred from the boat 9 to the wafer cassette 13 in the cassette shelf 4 in a reverse sequence from the above described order, and the wafer cassette 13 is transferred from the cassette shelf 4 to the cassette stage 3 by the cassette transfer device 5, and is transferred out by the external transport device which is not shown.

A maintenance of the internal devices is conducted after the semiconductor device manufacturing apparatus has been operated for a predetermined time period, or at predetermined time intervals. The boat 9 is replaced from the back by opening the back face maintenance door 41, a maintenance of the wafer transfer device 11 is performed from the side by opening the side maintenance door 47, a maintenance of the cassette transfer device 5 is performed from the side by opening the side panel 50, and a maintenance of the cassette stage 3 is performed from the front by opening the front panel 44.

In the above described semiconductor device manufacturing apparatus, the maintenance is performed from the three directions, i.e., from the front face , side face and back face. Generally, a plurality of semiconductor device manufacturing apparatuses are disposed side by side to form a manufacturing line. In the above described semiconductor device manufacturing apparatus as the tentative example, it has been found that there are problems that because the maintenance is performed from the three directions, i.e., from the front face, back face and side face, the semiconductor device manufacturing apparatuses can not be disposed without spaces therebetween, and a space for maintenance must be secured around each of the semiconductor device manufacturing apparatuses, and a large space is required for installing the apparatuses, and it is uneconomical.

Thereupon, in view of the above circumstances, the present inventors have attempted to improve the maintainability for the semiconductor device manufacturing apparatus, and to reduce a space required for installing the semiconductor device manufacturing apparatus, and have invented the semiconductor device manufacturing apparatus of the present invention which will be described hereafter.

It has also been found, by the present inventors, that the semiconductor device manufacturing apparatus as the tentative example have the following problems:

That is, in the course of the operation, the load lock chamber 7 is brought into an evacuated state. The load lock chamber 7 is substantially of a rectangular parallelepiped form, and a large bending load due to the external pressure is applied to the flat plate sidewall the inside of which is subjected to the reduced pressure. Therefore, as shown in FIG. 16, the sidewalls of the load lock chamber 7 is made thick so as to exhibit enough strength capable of withstanding the external force, and reinforcing thicker portions are provided at corners of the load lock chamber 7. Therefore, the load lock chamber 7 is increased in size, weight and manufacturing cost.

Further, when the load lock chamber 7 is restored to the atmospheric pressure, gas is introduced from the gas purge nozzles 45. Since the load lock chamber 7 is substantially rectangular in plane, gas stagnant regions 55 and 56 are generated between the gas purge nozzles 45 and 45 or at the corners. Eddy and gas stagnancy generated in the gas stagnant regions 55 and 56, causes whirl up or stagnancy of particles, and increases the possibility that the wafer is contaminated by particles. The contamination of the wafer by particles leads to deterioration in a processing quality, and yield.

(Embodiment of the Present Invention)

A semiconductor device manufacturing apparatus according to one embodiment of the present invention will be described with reference to the drawings.

Figure 1:
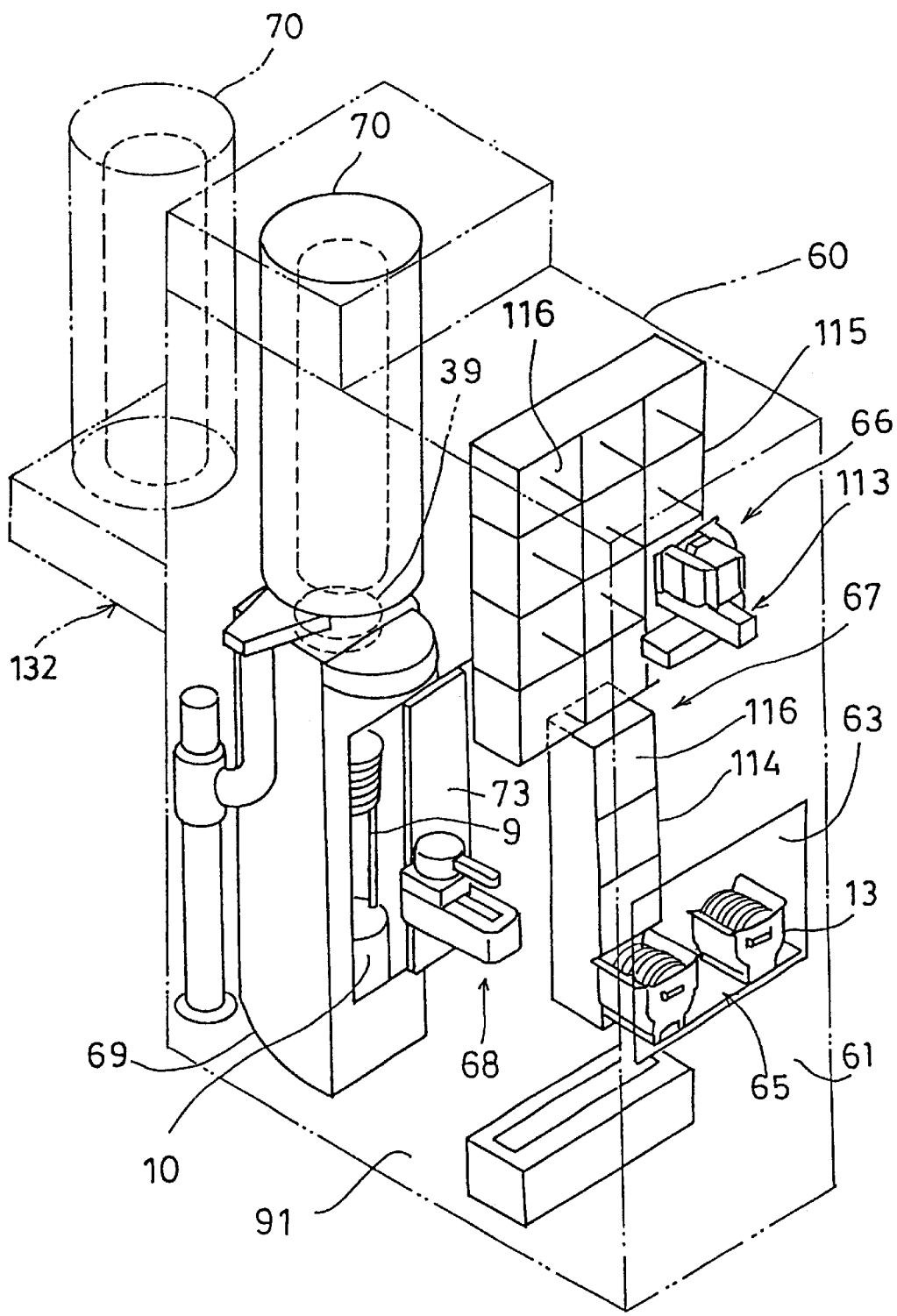
FIG. 1 is a schematic perspective view for explaining a semiconductor device manufacturing apparatus according to a one embodiment of the present invention.

First, referring to FIGS. 1 and 2, the entire structure of the semiconductor device manufacturing apparatus of the present embodiment will be described.

A housing 60 is provided at its front face with a front panel 61 for opening and closing through a hinge 62, and an access opening 63 is formed in the front panel 61. The access opening 63 is allowed to be opened and closed by a front shutter 64. A cassette stage 65 is provided adjacent to the access opening 63. A cassette transfer device 66 is disposed behind the cassette stage 65 and therefrom, a cassette shelf 67, a wafer transfer device 68, a load lock chamber 69 and a reaction furnace 70 are sequentially disposed toward the rear.

Positional relationship between the cassette stage 65, the cassette transfer device 66, the cassette shelf 67, the wafer transfer device 68, the load lock chamber 69 and the reaction furnace 70 is the same as that between the cassette stage 3, the cassette transfer device 5, the cassette shelf 4, the wafer transfer device 11, the load lock chamber 7 and the reaction furnace 6 which have been described with reference to FIGS. 15 and 16 and therefore, detailed descriptions therefor will be omitted. The same reference numerals designate the same elements and descriptions for such elements will be omitted. The transfer operations of the wafer cassette and the wafer as well as the processing of the wafer in the semiconductor device manufacturing apparatus are also the same as those described previously and thus, descriptions for the common things will also be omitted.

The load lock chamber 69 of the present embodiment will be described next.

An airtight container 71 of the load lock chamber 69 comprises a flat plate 71a and a cylindrically curved plate 71b and is formed into a semi-cylindrical shape. The flat plate 71a faces the wafer transfer device 68, and a wafer transfer opening 72 is formed in the flat plate 71a. The wafer transfer opening 72 is allowed to be opened and closed by a door gate valve 73. The boat 9 and the boat elevator 10 are disposed in the load lock chamber 69, and the load lock chamber 69 is provided above its upper portion with the reaction furnace 70.

Figure 12A:
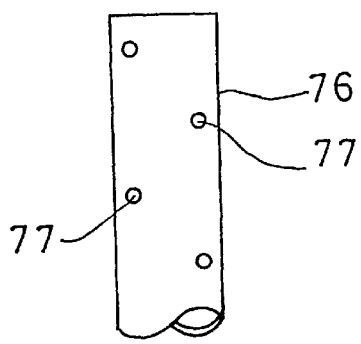
FIGS. 12A, 12B and 12C are partial enlarged views of a gas purge nozzle shown in FIG. 2.
Figure 12B:
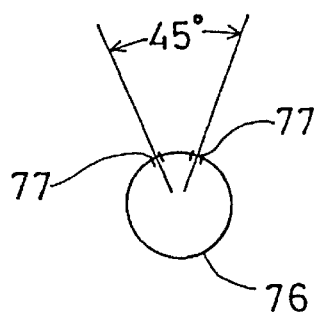
Figure 12C:
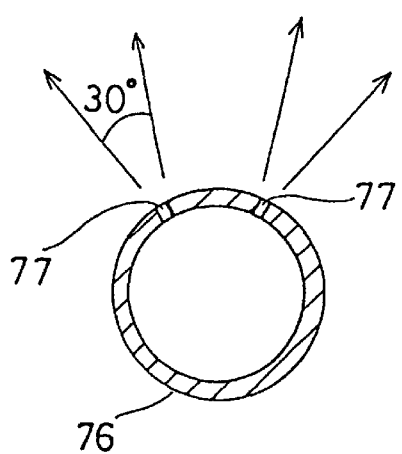

A predetermined number of (two, in the present embodiment) gas purge nozzles 76 are uprightly provided at a corner defined between the flat plate 71a and the cylindrically curved plate 71b of the load lock chamber 69. As shown in FIG. 12A, each of the gas purge nozzles 76 is provided with gas introducing holes 77 in a staggered arrangement to form two rows of gas introducing holes along generatrix, such that the angle formed between the gas introducing holes 77 belonging to the two rows is set to be 45° as shown in FIG. 12B.

A back face hole 78 is formed in the cylindrically curved plate 71b, and a flange 79 is provided around the back face hole 78. A back face maintenance door 82 is rotatably connected to the back face flange 79 through a hinge shaft 81, and is capable of airtightly closing the back face hole 78.

Figure 2:
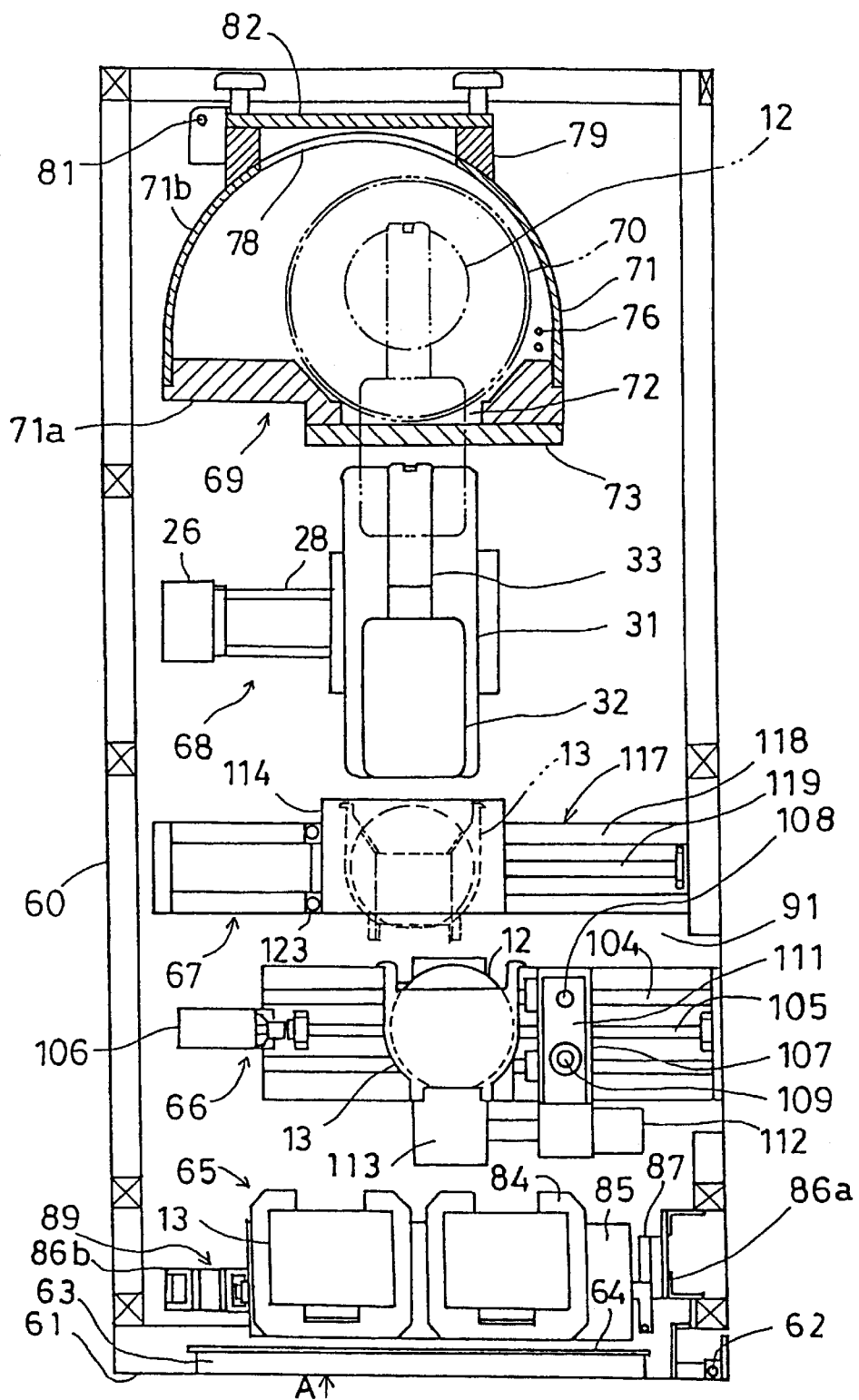
FIG. 2 is a transverse cross-sectional view for explaining the semiconductor device manufacturing apparatus according to the one embodiment of the present invention.

The front panel 61 can be turned in the counterclockwise direction in FIG. 2 about the hinge 62. The cassette stage 65 facing the front panel 61 will be described with reference to FIGS. 3 and 4.

Receiving plates 84 are provided on an upper surface of a frame 85, and can receive the wafer cassettes 13 thereon through the access opening 63. A column 86a is uprightly provided at a side of the housing 60. The frame 85 is mounted to the column 86a through a hinge 87 such that the frame 85 is allowed to rotate in the counterclockwise direction in FIG. 2. A grip 88 is fixed to a side (free end side of the frame 85) opposite to the hinge 87 of the frame 85, and a positioning section 89 for the cassette stage 65 is provided below the grip 88.

Figure 5:
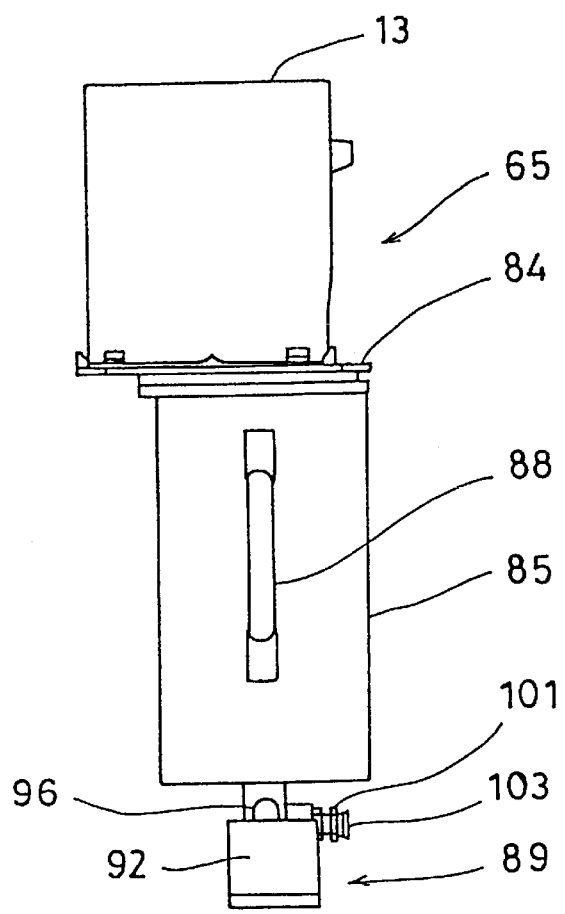
FIG. 5 is a side view for explaining the cassette stage in the semiconductor device manufacturing apparatus according to the one embodiment of the present invention.
Figure 6:
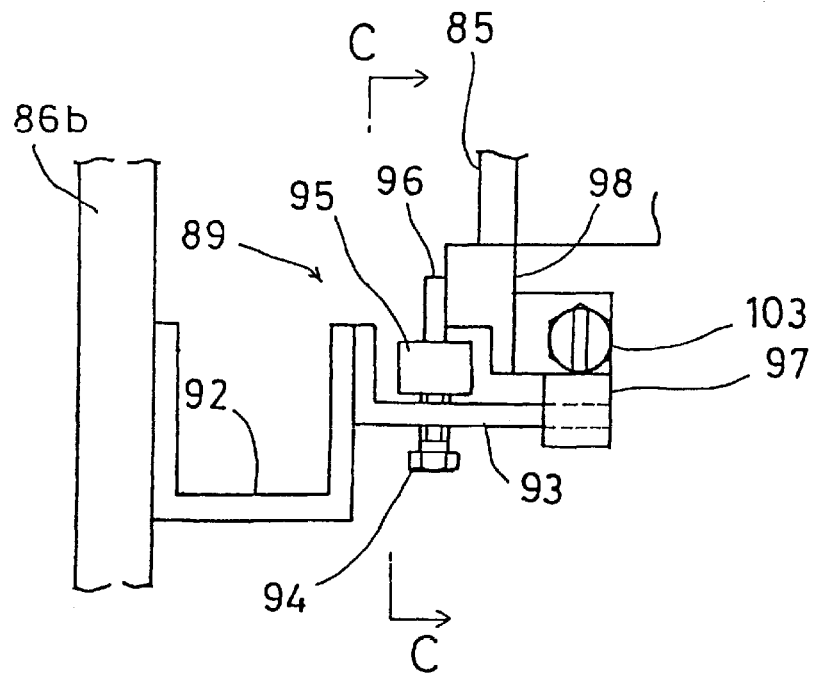
FIG. 6 is a partially enlarged view as viewed along the arrow B in FIG. 4 for explaining a positioning section of the cassette stage in the semiconductor device manufacturing apparatus according to the one embodiment of the present invention.
Figure 7:
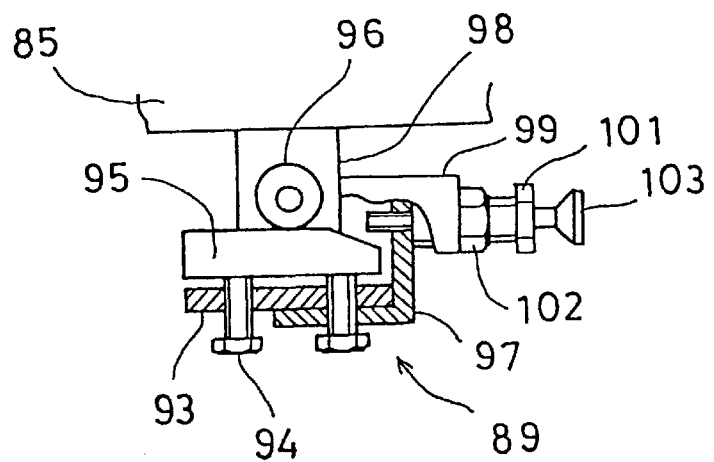
FIG. 7 is a view taken along the arrows C—C in FIG. 6.

The positioning section 89 will be described with reference to FIGS. 5 to 7.

In the housing 60, a column 86b is uprightly disposed to face the column 86a, a supporting metal fitting 92 of a square-cornered U-shaped cross-section is fixed to the column 86b, and a horizontally extending shelf plate 93 is fixed to the supporting metal fitting 92. Two level adjusting screws 94 are inserted into the shelf plate 93 through threads, a pedestal block 95 is provided on the level adjusting screws 94, and an L-shaped stopper 97 having an upright portion is fixed to the shelf plate 93 from a lower surface thereof such that an offset is formed toward a leading end of the pedestal block 95. An upper surface of a leading end portion of the pedestal block 95 is inclined downward so that a roller which will be described later can roll on the upper surface of the pedestal block 95.

A roller holder 98 is fixed on a lower surface of the free end of the frame 85, the roller 96 is rotatably mounted to the roller holder 98, and an adjusting bolt supporting piece 99 is fixed to a surface of the roller holder 98 opposite to the supporting metal fitting 92. The adjusting bolt supporting piece 99 includes a facing portion which is parallel to the upright portion of the stopper 97. A stopper bolt 101 is inserted through the facing portion through threads, and the stopper bolt 101 is fixed by a lock nut 102. The stopper bolt 101 is hollow, and an inner cylindrical face of a base end of the stopper bolt 101 is partially formed with threads. A fixing bolt 103 is formed at its tip end with threads, and is inserted through the stopper bolt 101, and the tip end of the fixing bolt 103 passing through the fixing bolt 103 is connected to the stopper 97 through threads.

Figure 3:
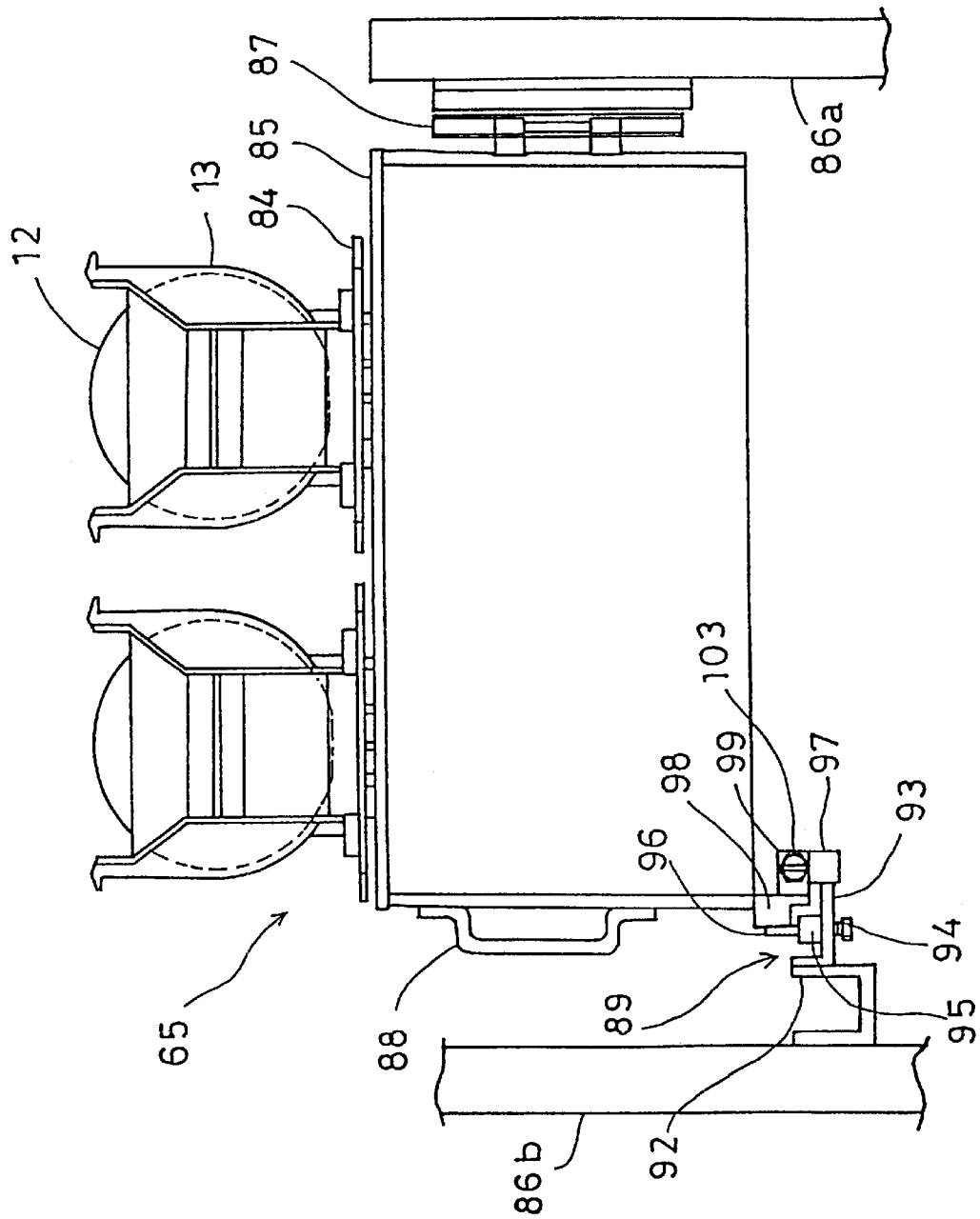
FIG. 3 is a front view of for explaining a cassette stage in the semiconductor device manufacturing apparatus according to the one embodiment of the present invention, as viewed along the arrow A in FIG. 2.
Figure 4:
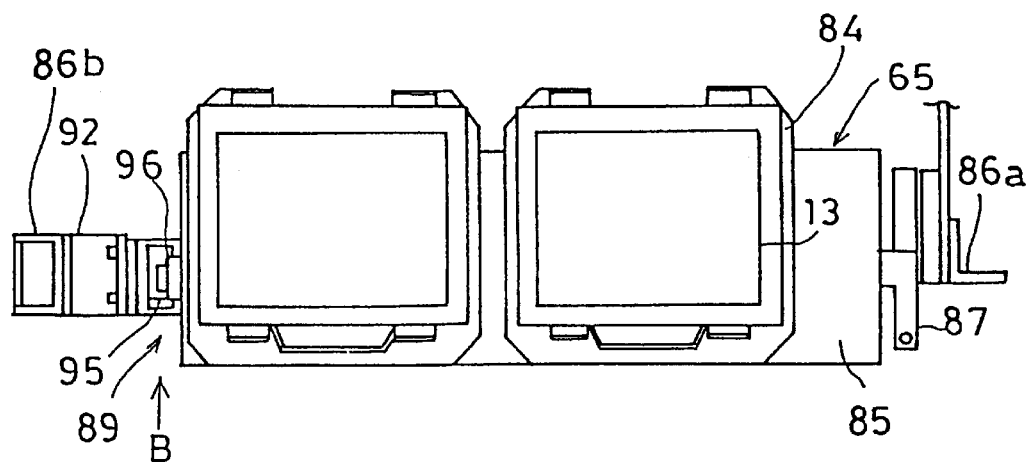
FIG. 4 is a plan view for explaining a cassette stage in the semiconductor device manufacturing apparatus according to the one embodiment of the present invention.

When the fixing bolt 103 is disengaged from the stopper 97, the frame 85 is turned about the hinge 87 forwardly (in the counterclockwise direction in FIG. 2, and in the vertically upper direction with respect to the sheet surface of FIG. 3). When the frame 85 is fixed, the frame 85 is turned rearward about the hinge 87. The roller 96 runs up onto the pedestal block 95, the roller 96 rolls and moves on the pedestal block 95, and the tip end of the stopper bolt 101 abuts against the stopper 97.

A level of the frame 85 is determined by a position of the upper surface of the pedestal block 95, and a horizontal position of the free end of the frame 85 is determined by a positional relationship between the stopper 97 and the adjusting bolt supporting piece 99. The level of the upper surface of the pedestal block 95 is adjusted by rotating the level adjusting screws 94, and the horizontal position of the free end of the frame 85 is adjusted by loosing the lock nut 102 to rotate the stopper bolt 101 so as to vary a projecting amount 102 of the tip end of the stopper bolt 101. After adjustment, the lock nut 102 is fasten to settle the adjustment.

By threading the fixing bolt 103 into the stopper 97 in a state where the stopper bolt 101 is abutted against the stopper 97, the final fixation of the frame 85 is completed. Even if the fixing bolt 103 is disengaged from the stopper 97, since a portion of the inner cylindrical face of the stopper bolt 101 is formed with threads, the fixing bolt 103 should not be disengaged from the stopper bolt 101.

The cassette transfer device 66 will be described with reference to FIG. 2.

A pair of guide shafts 104 parallel to the front panel is mounted to a bottom plate 91 of the housing 60, a threaded rod 105 is rotatably provided in parallel to the guide shafts 104, and a horizontally moving motor 106 is connected to the threaded rod 105. A horizontal slider 107 is slidably fitted to the guide shaft 104, and the horizontal slider 107 and the threaded rod 105 are threadedly engaged with each other through a nut block which is not shown. On the horizontal slider 107, a vertical guide shaft 108 is uprightly provided, and a vertical threaded rod 109 is rotatably provided uprightly. The vertical threaded rod 109 is connected to an elevating motor which is not shown. An elevating block 111 is slidably fitted to the vertical guide shaft 108, and is threadedly engaged with the vertical threaded rod 109 through a nut block which is not shown.

A cassette transfer mechanism 112 is mounted to the elevator block 11, and a transfer stage 113 arranged into one set is mounted to the cassette transfer mechanism 112. The transfer stage 113 can receive the wafer cassette 13 thereon, and can rotate the wafer cassette 13 about an axis parallel to the guide shaft 104. The transfer stage 113 supports the wafer cassette 13 such that the wafer cassette 13 can be advanced or retreated with respect to the cassette stage 65 and the cassette transfer device 66, and the cassette transfer mechanism 112 is adapted to rotate, advance and retreat the wafer cassette 13.

Figure 8:
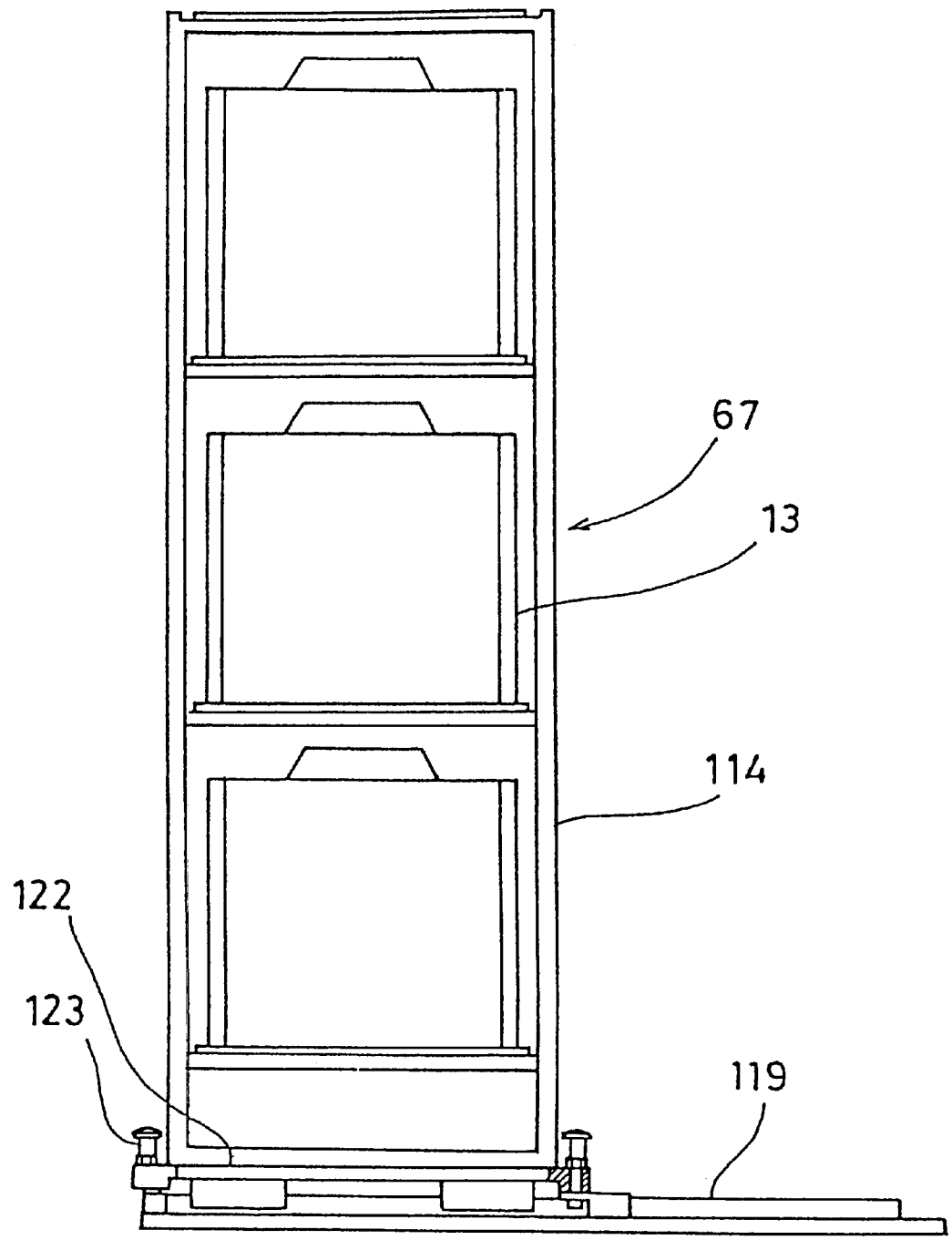
FIG. 8 is a front view showing a lower shelf of a cassette shelf in the semiconductor device manufacturing apparatus according to the one embodiment of the present invention.
Figure 9:
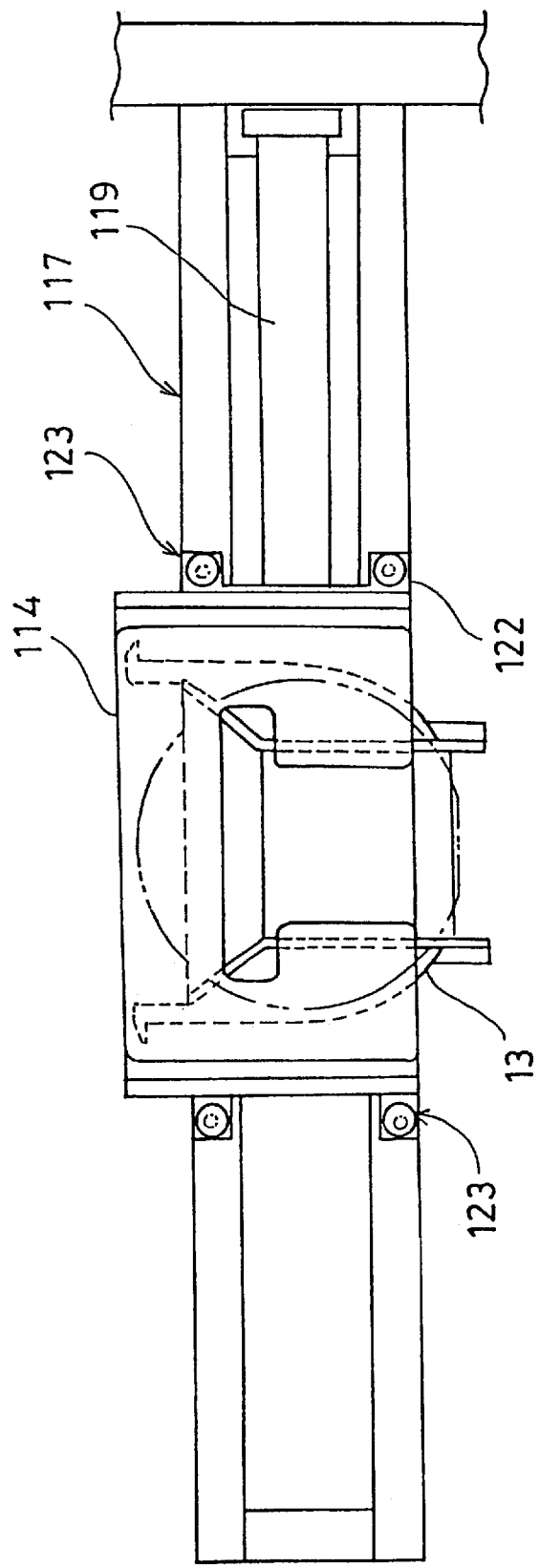
FIG. 9 is a plan view showing the lower shelf of the cassette shelf in the semiconductor device manufacturing apparatus according to the one embodiment of the present invention.
Figure 10:
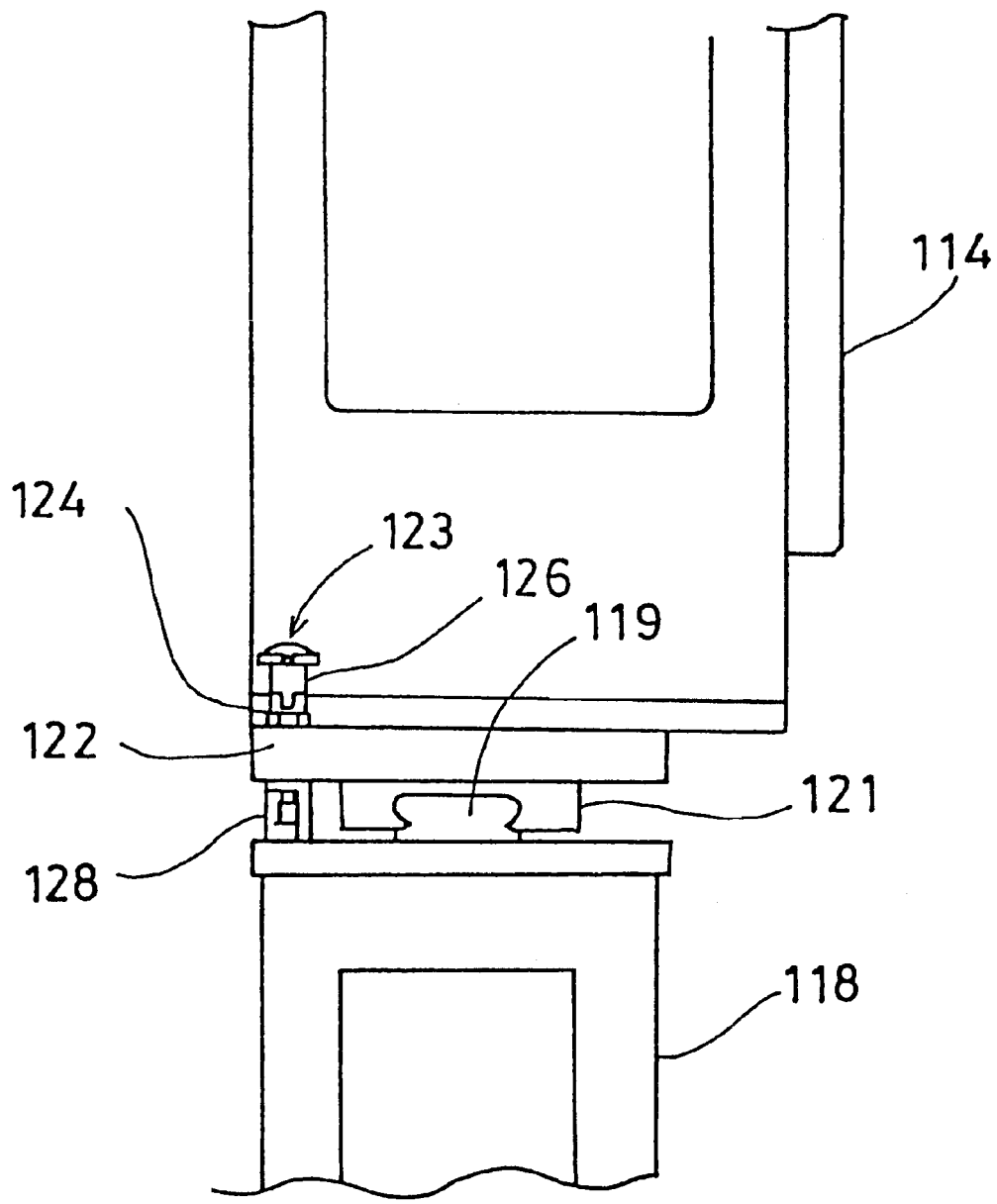
FIG. 10 is a partial enlarged view of a side lower portion of the lower shelf of the cassette shelf in the semiconductor device manufacturing apparatus according to the one embodiment of the present invention.

The cassette shelf 67 will be described with reference to FIGS. 8 to 10.

The cassette shelf 67 is provided so as to be opposed to the cassette transfer device 66, and opposed to the load lock chamber 69 through the wafer transfer device 68.

The cassette shelf 67 comprises a lower shelf 114 and an upper shelf 115. The lower shelf 114 is formed with a cassette accommodating frame 116 comprising four stages in one row, and the upper shelf 115 is formed with a cassette accommodating frame 116 comprising four stages in three rows. The lower shelf 114 is provided at its lower portion with a lower frame moving mechanism 117. The lower frame moving mechanism 117 fixes the lower shelf 114 when the semiconductor device manufacturing apparatus is operated, and can move the lower shelf 114 only when the maintenance is performed as will be described later. The lower shelf 114 can be moved horizontally by the lower frame moving mechanism 117.

A frame body 118 is fixed to the bottom plate 91, a slide guide 119 is fixed to the frame body 118 in parallel to the guide shaft 104, a slider 121 is slidably provided on the slide guide 119, and the lower shelf 114 is fixed to the slider 121 guide through a slide base 122, so that the lower shelf 114 can be moved along the slider 121.

Figure 11:
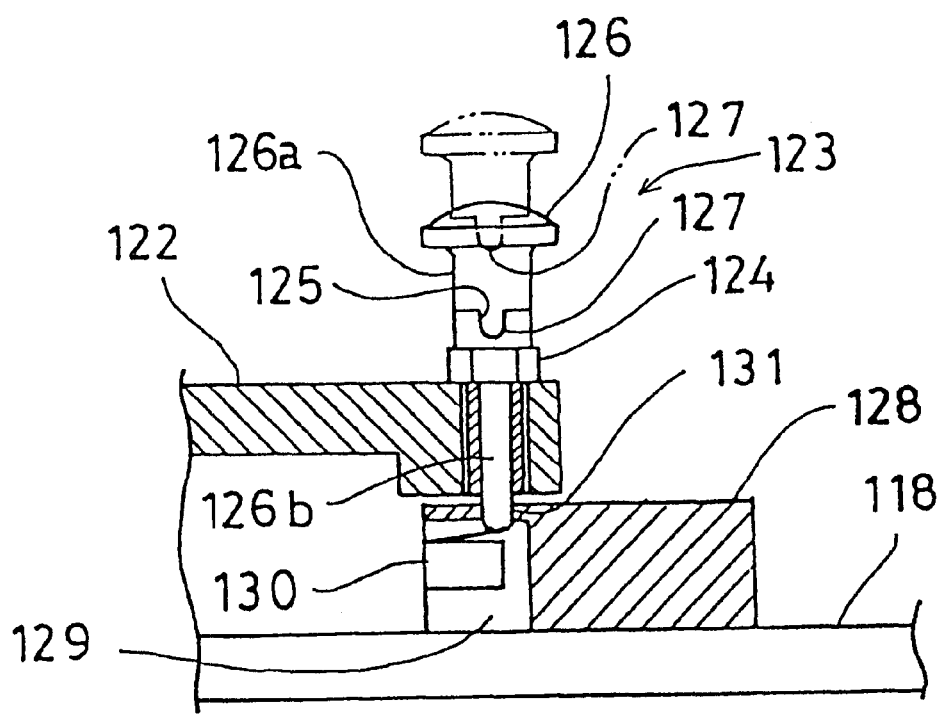
FIG. 11 is a partial enlarged view of a positioning mechanism of the lower shelf of the cassette shelf in the semiconductor device manufacturing apparatus according to the one embodiment of the present invention.

As described above, the lower shelf 114 is fixed when the semiconductor device manufacturing apparatus is operated, and a positional relation of the lower shelf 114 must be precise with respect to other elements when the wafer 12 is transferred between the boat 9 and the wafer cassette 13 accommodated on the lower shelf 114 by the wafer transfer device 68. Therefore, a positioning mechanism 123 is provided between the lower shelf 114 and the lower frame moving mechanism 117. The positioning mechanism 123 will be described with reference to FIG. 11.

The slide base 122 is projected in a sliding direction from the lower shelf 114. A stopper guide 124 is threadedly engaged with a projected portion of the slide base 122 at a location closer to widthwise end portion than the slider 121. The stopper guide 124 is hollow, and passes through the slide base 122, and is provided at its diametrically opposite upper ends with U-shaped grooves 125 along a diameter. A stopper 126 is slidably fitted to the stopper guide 124. The stopper 126 comprises a knob 126a and a shaft portion 126b, and the knob 126a is formed at its lower surface with projections 127 which can be fitted to the U-shaped grooves 125. The shaft portion 126b passes through the stopper guide 124 and projects from its lower surface, and can be fitted to a positioning block 128 which will be described below.

The positioning blocks 128 is disposed to correspond to a position of the lower shelf 114 when the semiconductor device manufacturing apparatus is operated, and to a position of the lower shelf 114 which is moved at the time of maintenance. A notch 129 is formed from a lower surface of the positioning block 128, and a microswitch 130 is provided in the notch 129. A positioning hole 131 is formed from an upper surface of the positioning block 128, and the positioning hole 131 is in alignment with a point of operation of the microswitch 130. The shaft portion 126b is adapted to fit to the positioning hole 131 and operate the microswitch 130.

The main structure of the wafer transfer device 68 is the same as that of the wafer transfer device 11 of the above described tentative example and hence, a description therefor will be omitted.

A heater moving mechanism 132 is provided at a back face of the housing 60 corresponding to the reaction furnace 70, so that the reaction furnace 70 can be moved outside of the housing 1 when a heater of the reaction furnace 70 is replaced, or a reaction tube in the reaction furnace 70 is cleaned, replaced or the like.

An operation will be described below.

The interior of the load lock chamber 69 is brought into the atmospheric pressure or is evacuated when the boat 9 is inserted into the reaction furnace 70, and is restored to the atmospheric pressure when the wafer 12 is transferred between the boat 9 and the lower shelf 114. In the evacuated state, a large external pressure acts on the flat plate 71a and the cylindrical curved plate 71b of the airtight container 71 due to a differential pressure between inside and outside. The flat plate 71a must be made thick because the bending force because the external pressure acts thereon. However, even if the external force acts on the cylindrical curved plate 71b, no bending force acts thereon, and a compression force and the like act on the cylindrical curved plate 71b. Therefore, the generated internal stress is extremely small, and a thickness of the cylindrical curved plate 71b may be extremely smaller than that of the flat plate 71a. Thus, the airtight container 71 can be extremely reduced in weight as compared with a case in which the airtight container 71 is formed into a rectangular parallelepipedic shape.

Next, when the interior of the load lock chamber 69 is restored, purging gas is flowed in from the gas purge nozzles 76. The gas introducing holes 77 belonging to one of the two gas purge nozzles 76 that is in the vicinity of the flat plate 71a are directed along the flat plate 71a, and the other gas introducing holes 77 belonging to the other gas purge nozzle 76 are directed along the cylindrical curved plate 71b.

Figure 13:
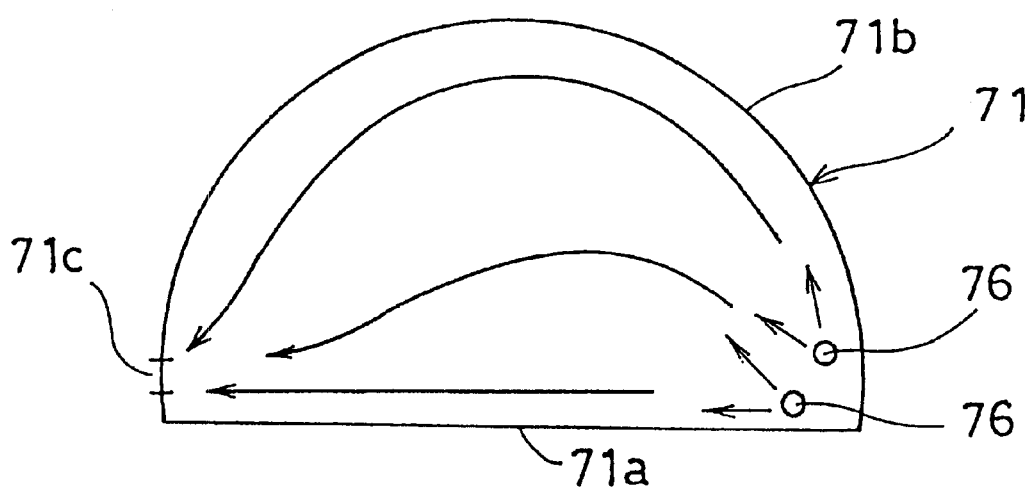
FIG. 13 is a diagram for explaining gas flow at the time of gas purge in the semiconductor device manufacturing apparatus according to the one embodiment of the present invention.

When the purging gas introduced from the gas purge nozzle 76 flows out from the gas introducing holes 77, the purging gas disperses in a range of about 30°. Therefore, the purging gases flowing in from the two gas purge nozzles 76 gradually spread following the sectional shape of the airtight container 71, and then are converged into an exhaust vent 71c and discharged, as shown by the arrows in FIG. 13. Therefore, a gas stagnant region is not generated, and a whirl up of the particles can be suppressed, and the load lock chamber 69 is kept clean.

Then, the interior of the load lock chamber 69 is restored to the atmospheric pressure, the boat 9 is lowered, the door gate valve 73 is opened, and a standby state for the transfer of the wafer 12 is completed.

The wafer cassette 13 transferred from the external transport device which is not shown is placed on the cassette stage 65. The horizontal slider 107 is horizontally moved by the horizontal moving motor 106, and the elevating block 111 is raised and lowered so that the transfer stage 113 faces one of the receiving plates 84 from which the cassette 13 is to be transferred. The transfer stage 113 receives the wafer cassette 13 thereon, and transfers the wafer cassette 13 to the lower shelf 114 with cooperation of the reversing movement as well as the advancing and retreating movements. Similarly, another wafer cassette 13 is also transferred from the receiving plate 84 to the upper shelf 115, and between the lower shelf 114 and the upper shelf 115.

The transfer of the wafer 12 to the boat 9 by the wafer transfer device 68 is carried out with respect to the lower shelf 114.

A position of the lower shelf 114 when the semiconductor device manufacturing apparatus is operated is directly opposite to the wafer transfer device 68, and the lower shelf 114 is fixedly positioned by the positioning mechanism 123. The wafer transfer device 68 transfers the wafer 12 from the wafer cassette 13 to the boat 9 with cooperation of the advancing and retreating movements of the wafer chuck 32, raising and lowering movements and the rotating movement of the elevating stage 31. The transfer of the wafer 12 is carried out with respect to some of the wafer cassettes 13, and after a predetermined amount of wafers 12 have been transferred to the boat 9, the door gate valve 73 is closed, and the load lock chamber 69 is evacuated.

After the evacuation is completed, or when a gas is introduced from the gas purge nozzles 76 and the interior of the load lock chamber 69 is restored to the atmospheric pressure after the evacuation is completed, the furnace lid 39 is opened, and the boat 9 is inserted into the reaction furnace 70 by the boat elevator 10. After a necessary process such as formation of a thin film on the wafer 12 has been carried out in the reaction furnace 70, the furnace lid 39 is opened, and the boat 7 is retrieved by the boat elevator 10. The door gate valve 73 is opened in a state where the interior of the load lock chamber 69 is at the atmospheric pressure.

The processed wafer 12 is transferred from the boat 9 to the wafer cassette 13 of the cassette shelf 67 in a reverse sequence from the above described order, and the wafer cassette 13 is transferred from the cassette shelf 67 to the cassette stage 65 by the cassette transfer device 66, and is transferred out by the external transport device which is not shown.

A maintenance of the internal devices is conducted after the semiconductor device manufacturing apparatus has been operated for a predetermined time period, or at predetermined time intervals. The boat 9 is replaced from the back by opening the back face maintenance door 82, and a maintenance of the wafer transfer device 68 and the cassette transfer device 66 is performed from the front by opening the front panel 61.

A maintenance operation will be described with reference to FIG. 14.

The front panel 61 is turned about the hinge 62 to open the front face of the housing 60. The maintenance of the cassette stage 65 can be performed from the front side.

Further, the fixing bolt 103 of the positioning section 89 of the cassette stage 65 is removed from the stopper 97 to turn the cassette stage 65 toward the front face, thereby opening the front portion of the housing 60. The maintenance can be performed of the cassette transfer device 66 from the front side.

Figure 14:
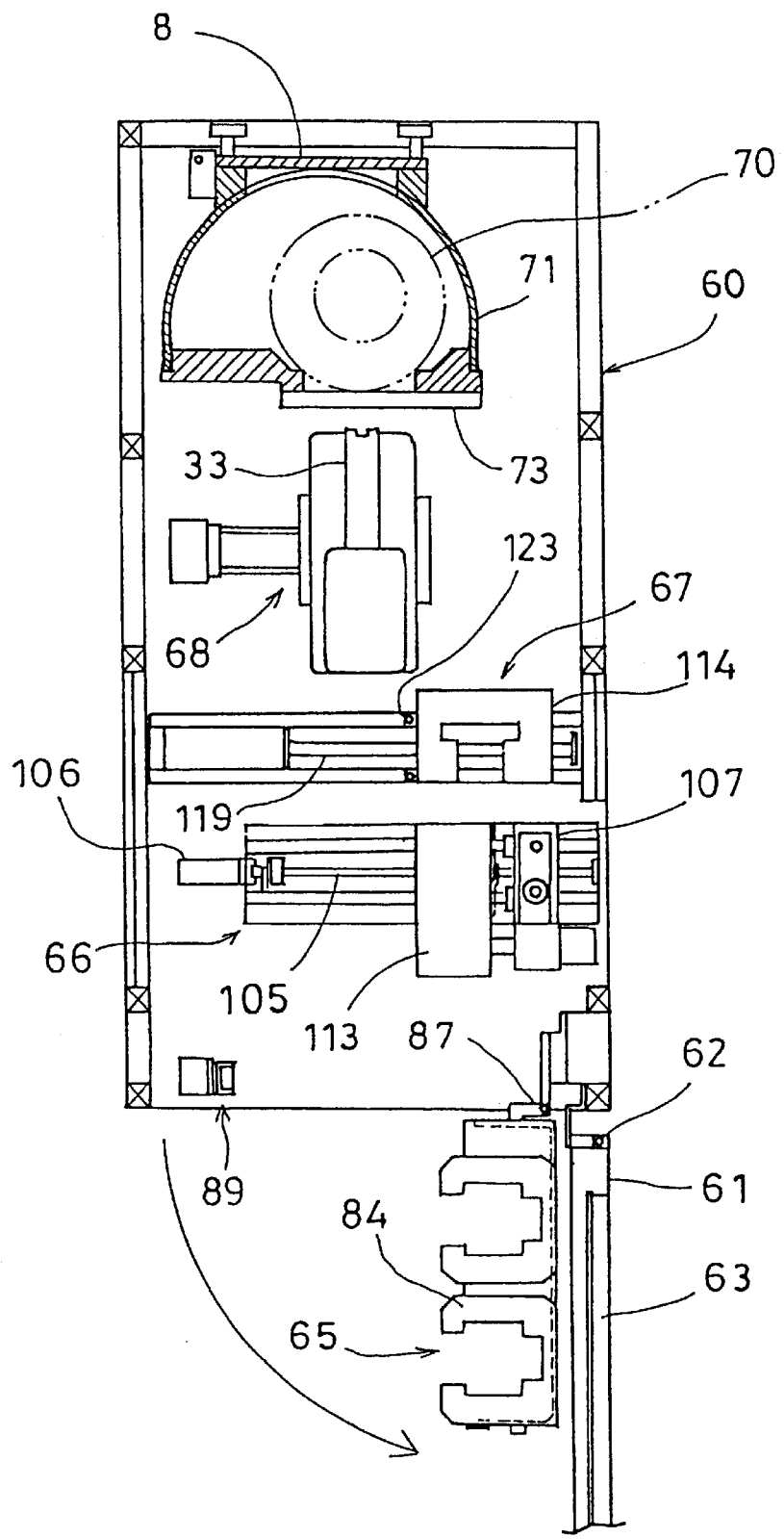
FIG. 14 is a transverse cross-sectional view for showing the operation at the time of maintenance in the semiconductor device manufacturing apparatus according to the one embodiment of the present invention.

Further, the horizontal moving motor 106 is driven to move the horizontal slider 107 up to the end of a rightward stroke in FIG. 14, and to raise the transfer stage 113 up to an upper end position. Since the transfer stage 113 is arranged into one set, by moving the transfer stage 113 to the upper right end, a space required for the maintenance can be secured on the left hand side of the transfer stage 113, and the maintenance for the cassette shelf 67 can be performed from the front side.

Furthermore, the positioning mechanism 123 of the cassette shelf 67 is released. The stopper 126 is pulled up and is turned by 90°. The shaft portion 126b is disengaged from the positioning hole 131 to bring the positioning mechanism 123 into a released state, and the microswitch 130 is brought into a non-operating state. By turning the knob 126a, the projections 127 run up onto the upper end surf ace of the stopper guide 124 to maintain the released state of the positioning mechanism 123. The lower shelf 114 is moved to the right end along the slide guide 119. Since the cassette accommodating frame 116 of the lower shelf 114 has only one row, a sufficient space for the maintenance of the wafer transfer device 68 can be secured, and the maintenance of the wafer transfer device 68 can be performed from the front side.

As described above, the maintenance of the load lock chamber 69 is performed from the back side, and the maintenance of the cassette stage 65, the cassette transfer device 66, the cassette shelf 67 and the wafer transfer device 68 is performed from the front side.

When the semiconductor device manufacturing apparatus is returned to the operating state, the reverse sequence to that of the maintenance sequence may be conducted. The microswitch 130 is for electrically confirm whether the operating state has surely been set, or whether the maintenance state has surely been set, and it is needless to say that the same switches are similarly provided for the cassette transfer device 66 and the cassette stage 65. Each of the units are mechanically positioned, and such positions are confirmed electrically. Such electrical signals can be used for safety confirmation for the operator. For example, when the lower shelf 114 is in a position for maintenance (i.e., the lower shelf 114 is moved to the side) at the time of maintenance, the safety of the operator can be secured by using the electrical signal as a control signal for absolutely stopping the cassette transfer device 66 which is behind the operator.

In the above, the description is made taking a semiconductor wafer 12 as an example, the present invention is also preferably applicable to a various kinds of electronic component manufacturing substrate, such as a glass substrate for a liquid crystal display device.

As described above, the present invention exhibits excellent effects such that the maintenance of a mechanism or unit which requires the maintenance within the semiconductor device manufacturing apparatus can be performed from the front side of the manufacturing apparatus, it is unnecessary to secure a space for the maintenance at the outside of the side of the semiconductor device manufacturing apparatus, only a small space suffices for installing the semiconductor device manufacturing apparatus, it is possible to largely save space especially when the semiconductor device manufacturing apparatuses are disposed side by side to form a manufacturing line, it becomes unnecessary for an operator to change his or her position whenever a device or a portion subject to the maintenance is changed, which operator's moving is troublesome, and the operating properties can be enhanced.

What is claimed is:

1. A maintenance method for a substrate processing apparatus which comprises a substrate processing chamber, a substrate transfer device and a substrate carrier holding unit, wherein said substrate processing chamber, said substrate transfer device and said substrate carrier holding unit are disposed in this named order, and said substrate carrier holding unit is movable between a first substrate processing time position and a first maintenance time position, comprising the steps of:

moving said substrate carrier holding unit from said first substrate processing time position to said first maintenance time position, and thereafter performing a maintenance for said substrate transfer device.

2. A maintenance method for a substrate processing apparatus as recited in claim 1, wherein said substrate processing apparatus further comprises a load lock chamber, and said substrate processing chamber, said load lock chamber, said substrate transfer device and said substrate carrier holding unit are disposed in this named order, or said substrate processing chamber, said substrate transfer device and said substrate carrier holding unit are disposed in this named order and said substrate processing chamber and said load lock chamber are vertically disposed.

3. A maintenance method for a substrate processing apparatus as recited in claim 1, wherein said substrate processing apparatus further comprises a housing for covering said substrate processing chamber, said substrate transfer device and said substrate carrier holding unit, said first substrate processing time position of said substrate carrier holding unit is a position directly opposed to said substrate transfer device, said first maintenance time position is a position at the side of one side face of said housing, and said step of moving said substrate carrier holding unit from said first substrate processing time position to said first maintenance time position is a step of moving said substrate carrier holding unit from the position directly opposed to said substrate transfer device to the position at the side of the one side face of said housing.

4. A maintenance method for a substrate processing apparatus as recited in claim 2, wherein said substrate processing apparatus further comprises a housing for covering said substrate processing chamber, said load lock chamber, said substrate transfer device and said substrate carrier holding unit, said first substrate processing time position of said substrate carrier holding unit is a position directly opposed to said substrate transfer device, said first maintenance time position is a position at the side of one side face of said housing, and said step of moving said substrate carrier holding unit from said first substrate processing time position to said first maintenance time position is a step of moving said substrate carrier holding unit from the position directly opposed to said substrate transfer device to the position at the side of the one side face of said housing.

5. A maintenance method for a substrate processing apparatus as recited in claim 1, wherein said substrate carrier holding unit comprises a plurality of substrate carrier holding sections, in one vertical row, each for holding a substrate carrier.

6. A maintenance method for a substrate processing apparatus as recited in claim 1, wherein said substrate processing apparatus further comprises a first positioning and fixing mechanism at said first substrate processing time position and a second positioning and fixing mechanism at said first maintenance time position, said substrate carrier holding unit is allowed to be positioned and fixed at said first substrate processing time position by said first positioning and fixing mechanism and at said first maintenance time position by said second positioning and fixing mechanism, and said maintenance method further comprises the step of positioning and fixing said substrate carrier holding unit at said first maintenance time position by said second positioning and fixing mechanism after said substrate carrier holding unit is moved to said first maintenance time position.

7. A maintenance method for a substrate processing apparatus as recited in claim 1, wherein said substrate processing apparatus further comprises a substrate carrier transfer device, said substrate processing chamber, said substrate transfer device, said substrate carrier holding unit and said substrate carrier transfer device are disposed in this named order, and said substrate carrier transfer device is movable between a second substrate processing time position and a second maintenance time position of said substrate carrier transfer device, and said maintenance method further comprises the step of moving said substrate carrier transfer device to said second maintenance time position.

8. A maintenance method for a substrate processing apparatus as recited in claim 7, wherein said substrate processing apparatus further comprises a detector for detecting that said substrate carrier holding unit is at said first maintenance time position when said substrate carrier holding unit is at said first maintenance time position and for outputting a detection signal to stop said substrate carrier transfer device at said second maintenance time position based on said detection signal, and said maintenance method further comprises the step of detecting that said substrate carrier holding unit is at said first maintenance time position when said substrate carrier holding unit is at said first maintenance time position and outputting the detection signal to stop said substrate carrier transfer device at said second maintenance time position based on said detection signal.

9. A maintenance method for a substrate processing apparatus as recited in claim 2, wherein said substrate processing apparatus further comprises: a substrate carrier transfer device; and a housing for covering said substrate processing chamber, said substrate transfer device, said substrate carrier holding unit, said substrate carrier transfer device and said load lock chamber, said substrate processing chamber, said substrate transfer device, said substrate carrier holding unit and said substrate carrier transfer device are disposed in this named order, said substrate carrier transfer device is movable between a second substrate processing time position and a second maintenance time position of said substrate carrier transfer device, said substrate processing chamber and said load lock chamber are vertically disposed, said substrate carrier transfer device comprises a holding section for holding a substrate carrier, said second maintenance time position is an upper portion within said housing at a side of one side face thereof when said substrate processing chamber is disposed on or above said load lock chamber, said second maintenance time position is a lower portion within said housing at the side of the one side face thereof when said substrate processing chamber is disposed under said load lock chamber, and said step of moving said substrate carrier transfer device to said second maintenance time position is; a step of moving said substrate carrier transfer device to the upper position within said housing at the side of one side face thereof when said substrate processing chamber is disposed on or above said load lock chamber; or a step of moving said substrate carrier transfer device to the lower position within said housing at the side of one side face thereof when said substrate processing chamber is disposed under said load lock chamber.

10. A maintenance method for a substrate processing apparatus as recited in claim 1, wherein said substrate processing apparatus further comprises a housing for covering said substrate processing chamber, said substrate transfer device and said substrate carrier holding unit; and a substrate carrier bringing in/out section, said substrate carrier bringing in/out section is capable of rotating forward of said housing, whereby at least a portion of a front face of said housing can be opened, and said maintenance method further comprises the step of rotating said substrate carrier bringing in/out section forward of said housing, whereby at least said portion of the front face of said housing is opened.

11. A maintenance method for a substrate processing apparatus as recited in claim 1, wherein an additional apparatus is allowed to be disposed in the immediate vicinity of said substrate processing apparatus such that one side face of said substrate processing apparatus is opposed to one side face of said additional apparatus.

12. A maintenance method for a substrate processing apparatus as recited in claim 1, wherein said substrate processing apparatus is a semiconductor device manufacturing apparatus.

13. A maintenance method for a substrate processing apparatus which comprises a substrate processing chamber, a substrate carrier transfer device, a substrate carrier bringing in/out section and a housing for covering said substrate processing chamber, said substrate carrier transfer device and said substrate carrier bringing in/out section, wherein said substrate processing chamber, said substrate carrier transfer device and said substrate carrier bringing in/out section are disposed in this named order, and said substrate carrier bringing in/out section is capable of rotating forward of said housing, whereby at least a portion of a front face of said housing can be opened, comprising the steps of:

rotating said substrate carrier bringing in/out section forward of said housing, whereby at least said portion of the front face of said housing is opened, and performing a maintenance of said substrate processing apparatus between said substrate processing chamber and said substrate carrier bringing in/out section.

14. A maintenance method for a substrate processing apparatus as recited in claim 13, wherein said substrate carrier transfer device is movable between a first substrate processing time position and a first maintenance time position of said substrate carrier transfer device, and said maintenance method further comprises the step of moving said substrate carrier transfer device to said first maintenance time position.

15. A maintenance method for a substrate processing apparatus as recited in claim 14, wherein said substrate carrier bringing in/out section is capable of rotating about the vicinity of one side face of said housing, and said first maintenance time position is a position at the side of said one side face of said housing, said step of rotating said substrate carrier bringing in/out section forward of said housing whereby at least said portion of the front face of said housing is opened is a step of rotating said substrate carrier bringing in/out section forward of said housing about the vicinity of said one side face of said housing, whereby at least said portion of the front face of said housing is opened, and said step of moving said substrate carrier transfer device to said first maintenance time position is a step of moving said substrate carrier transfer device to the position at the side of said one side face of said housing.

16. A maintenance method for a substrate processing apparatus as recited in claim 14, wherein said substrate processing apparatus further comprises a substrate carrier holding unit, said housing covers said substrate carrier holding unit, said substrate processing chamber, said substrate carrier holding unit, said substrate carrier transfer device and said substrate carrier bringing in/out section are disposed in this named order, said substrate carrier holding unit is movable between a second substrate processing time position and a second maintenance time position of said substrate carrier holding unit, and said maintenance method further comprises the step of moving said substrate carrier holding unit to said second maintenance time position.

17. A maintenance method for a substrate processing apparatus as recited in claim 16, wherein said substrate carrier bringing in/out section is capable of rotating about the vicinity of one side face of said housing, said first maintenance time position is a position at the side of said one side face of said housing, said second maintenance time position is a position at the side of said one side face of said housing, said step of moving said substrate carrier transfer device to said first maintenance time position is a step of moving said substrate carrier transfer device to the position at the side of said one side face of said housing, and said step of moving said substrate carrier holding unit to said second maintenance time position is a step of moving said substrate carrier holding unit to the position at the side of said one side face of said housing.

18. A maintenance method for a substrate processing apparatus as recited in claim 16, wherein said substrate processing apparatus further comprises a first positioning and fixing mechanism at said second substrate processing time position and a second positioning and fixing mechanism at said second maintenance time position, said substrate carrier holding unit is allowed to be positioned and fixed at said second substrate processing time position by said first positioning and fixing mechanism and at said second maintenance time position by said second positioning and fixing mechanism, and said maintenance method further comprises the step of positioning and fixing said substrate carrier holding unit at said second maintenance time position by said second positioning and fixing mechanism.

19. A maintenance method for a substrate processing apparatus as recited in claim 16, wherein said substrate processing apparatus further comprises a detector for detecting that said substrate carrier holding unit is at said second maintenance time position when said substrate carrier holding unit is at said second maintenance time position and for outputting a detection signal to stop said substrate carrier transfer device at said first maintenance time position based on said detection signal, and said maintenance method further comprises the step of detecting that said substrate carrier holding unit is at said second maintenance time position when said substrate carrier holding unit is at said second maintenance time position and outputting the detection signal to stop said substrate carrier transfer device at said first maintenance time position based on said detection signal.

20. A maintenance method for a substrate processing apparatus as recited in claim 16, wherein said substrate carrier holding unit comprises a plurality of substrate carrier holding sections, in one vertical row, for holding said substrate carrier.

21. A maintenance method for a substrate processing apparatus as recited in claim 14, wherein said substrate processing apparatus further comprises a load lock chamber, said housing covers said load lock chamber, said substrate processing chamber and said load lock chamber are vertically disposed, said substrate carrier transfer device comprises a holding section for holding one said substrate carrier, said first maintenance time position is an upper portion within said housing at the side of one side face thereof when said substrate processing chamber is disposed on or above said load lock chamber, and said first maintenance time position is a lower portion within said housing at the side of one side face thereof when said substrate processing chamber is disposed under said load lock chamber, and said step of moving said substrate carrier transfer device to said first maintenance time position is; a step of moving said substrate carrier transfer device to said upper position within said housing at the side of said one side face thereof when said substrate processing chamber is disposed on or above said load lock chamber; or a step of moving said substrate carrier transfer device to said lower position within said housing at the side of said one side face thereof when said substrate processing chamber is disposed under said load lock chamber.

22. A maintenance method for a substrate processing apparatus as recited in claim 13, wherein an additional apparatus is allowed to be disposed in the immediate vicinity of said substrate processing apparatus such that one side face of said substrate processing apparatus is opposed to one side face of said additional apparatus.

23. A maintenance method for a substrate processing apparatus as recited in claim 13, wherein said substrate processing apparatus is a semiconductor device manufacturing apparatus.

24. A maintenance method for a substrate processing apparatus which comprises a substrate processing chamber, a substrate transfer device, a substrate carrier holding unit, a substrate carrier transfer device and a substrate carrier bringing in/out section in this named order, comprising the steps of:

moving said substrate carrier bringing in/out section to a maintenance position;

moving said substrate carrier transfer device to a maintenance position;

moving said substrate carrier holding unit to a maintenance position; and performing a maintenance for said substrate transfer device.

25. A maintenance method for a substrate processing apparatus as recited in claim 24, wherein said substrate processing apparatus is a semiconductor device manufacturing apparatus.

* * * * *